United States Patent
Hao et al.

(10) Patent No.: US 7,071,075 B2
(45) Date of Patent: Jul. 4, 2006

(54) STI FORMING METHOD FOR IMPROVING STI STEP UNIFORMITY

(75) Inventors: Chung-Peng Hao, Sinjhuang (TW); Yi-Nan Chen, Taipei (TW)

(73) Assignee: NANYA Technology Corporation, Taoyuan (TW)

( * ) Notice: Subject to any disclaimer, the term of this patent is extended or adjusted under 35 U.S.C. 154(b) by 106 days.

(21) Appl. No.: 10/728,983

(22) Filed: Dec. 8, 2003

(65) Prior Publication Data

US 2005/0124134 A1 Jun. 9, 2005

(51) Int. Cl.
*H01L 21/76* (2006.01)

(52) U.S. Cl. .................................................. 438/427

(58) Field of Classification Search .............. None
See application file for complete search history.

(56) References Cited

U.S. PATENT DOCUMENTS

| | | | | |
|---|---|---|---|---|
| 4,994,406 A * | 2/1991 | Vasquez et al. | ............. | 438/426 |
| 5,382,541 A * | 1/1995 | Bajor et al. | ................. | 438/427 |
| 5,504,033 A * | 4/1996 | Bajor et al. | ................. | 438/405 |
| 5,536,675 A * | 7/1996 | Bohr | ......................... | 438/427 |
| 5,721,172 A * | 2/1998 | Jang et al. | .................. | 438/424 |
| 6,051,496 A * | 4/2000 | Jang | ........................... | 438/687 |
| 6,114,220 A * | 9/2000 | Tsai | ........................... | 438/435 |
| 6,207,533 B1 * | 3/2001 | Gao | ........................... | 438/424 |
| 6,207,534 B1 * | 3/2001 | Chan et al. | ................. | 438/427 |
| 6,294,423 B1 * | 9/2001 | Malik et al. | ................ | 438/241 |
| 6,630,390 B1 * | 10/2003 | Andideh et al. | ............ | 438/427 |
| 6,667,226 B1 * | 12/2003 | Pinto et al. | ................. | 438/524 |
| 6,779,452 B1 * | 8/2004 | Schneider et al. | .......... | 101/477 |
| 6,864,151 B1 * | 3/2005 | Yan et al. | ................... | 438/424 |
| 6,869,860 B1 * | 3/2005 | Belyansky et al. | ......... | 438/435 |
| 6,908,807 B1 * | 6/2005 | Rueger | ....................... | 438/221 |

* cited by examiner

*Primary Examiner*—David A. Zarneke
(74) *Attorney, Agent, or Firm*—Bacon & Thomas, PLLC

(57) ABSTRACT

Disclosed is a shallow trench isolation (STI) forming method for improving STI step uniformity. The method deposits an oxidation layer to a semiconductor structure formed with STIs. After a planarization material layer is formed on the oxidation, then CMP process is performed. By using the method of the present invention, the STI step uniformity can be raised.

6 Claims, 5 Drawing Sheets

STI FORMING METHOD FOR IMPROVING STI STEP UNIFORMITY

BACKGROUND OF THE INVENTION

1. Field of the Invention

This invention relates to a process for shallow trench isolation (STI) in a semiconductor structure, more specifically, to a method for improving the STI step uniformity.

2. Description of the Prior Art

In the manufacturing process for semiconductor integrated circuits such as DRAMs, shallow trench isolations (STI) are often used to isolate the respective elements.

Generally, in the semiconductor device such as a DRAM, a pad oxide layer with a thickness of about tens angstrom is deposited on a substrate, and then a pad nitride layer, of which the material can be SiN, with a thickness of about a thousand angstrom above is deposited on the pad oxide layer. The intermediate structure having the substrate, the pad oxide layer and the pad nitride layer is subject to steps of photo-mask developing, etching and removing the mask and the like to form shallow trench isolations. The formation of STIs separate active regions of the semiconductor structure.

With reference to FIG. 1, a structure in shown with STIs 20 and 21 formed. In this drawing, the reference numbers 10 and 11 indicate substrate, 12 and 13 indicate pad oxide layers, 14 and 15 indicate pad nitride layers. As shown, in the whole semiconductor device structure, a phenomenon that the STIs 20 and 21 in different regions have different depths is likely to happen.

With reference to FIG. 2, under the situation that the depths of STIs 20 and 21 are not uniform, when using high density plasma (HDP), for example, to form an oxide layer 30 on the whole structure, the overfill thickness t of the oxide at the region of the shallow STI 20 will be thicker than that at the region of the deep STI 21.

Then, the oxide layer 30 is planarized by chemical mechanical polishing (CMP). The height difference between the top of the planarized oxide layer 30 and the top of the substrate of the active region is referred to STI step. As can be seen from FIG. 3, since the overfill thicknesses of the oxide are different, after planarization, the STI steps in the regions of STIs of different depths are different. As shown in the right part of FIG. 3, it is possible that the nitride layer 15 is partially removed in the polishing step.

In the process for DRAM, the active regions separated from each other by the STIs will have gates or bit lines formed thereon. Generally, in DRAM structure, the non-uniformity of the STI steps is likely to cause gate stringer, thereby causing improper short circuit between the gates or between the gate and bit line.

Therefore, a solution to solve the above problems is necessary. The present invention satisfies such a need.

SUMMARY OF THE INVENTION

An objective of the present invention is to provide a STI forming method, which can improve the uniformity of STI steps.

According to an aspect of the present invention, a STI forming method for improving STI step uniformity has the steps of depositing an oxide layer on a semiconductor structure formed with STIs, and forming a planarizing material layer on the oxide layer, then performing chemical mechanical polishing process.

According to another aspect of the present invention, in the STI forming method for improving STI step uniformity, the material of the planarizing material layer is boron phosphorus silicate glass (BPSG), and is subject to heat reflow process.

According to a further aspect of the present invention, in the STI forming method for improving STI step uniformity, the material of the planarizing material layer is anti-reflective material.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETAILED DESCRIPTION OF THE PREFERRED EMBODIMENT

The technical contents, objectives and achieved effects of the present invention will be described further in detail with the following embodiment.

Figure 1:
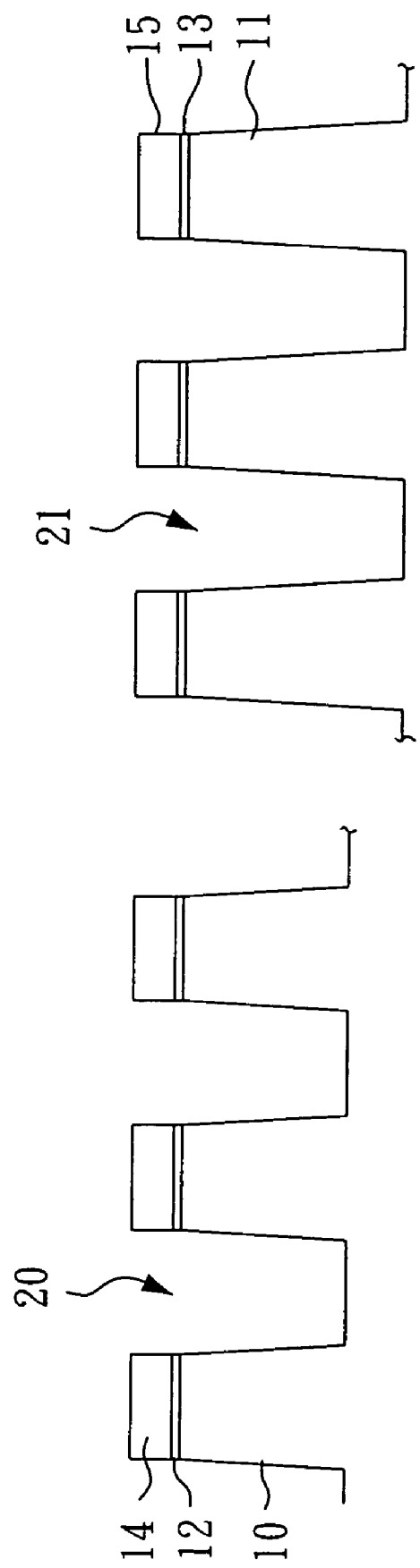
FIG. 1 shows a prior art semiconductor device structure having shallow trench isolations formed therein.
Figure 2:
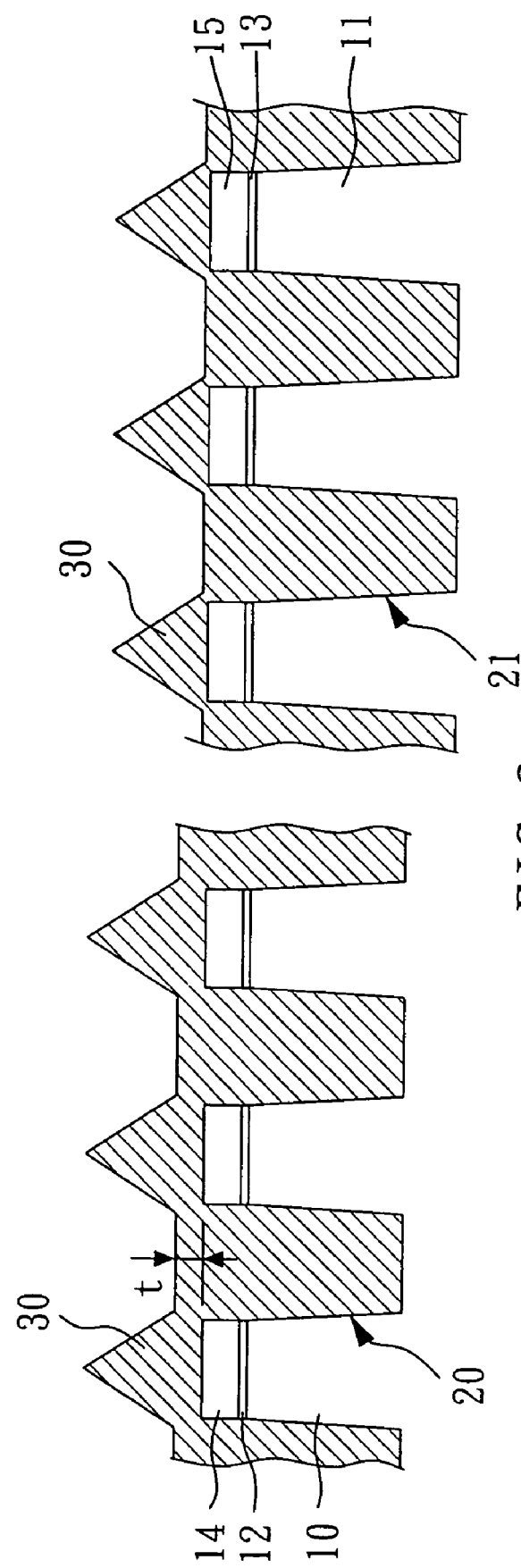
FIG. 2 shows the structure of FIG. 1 having an oxide layer formed thereon.
Figure 3:
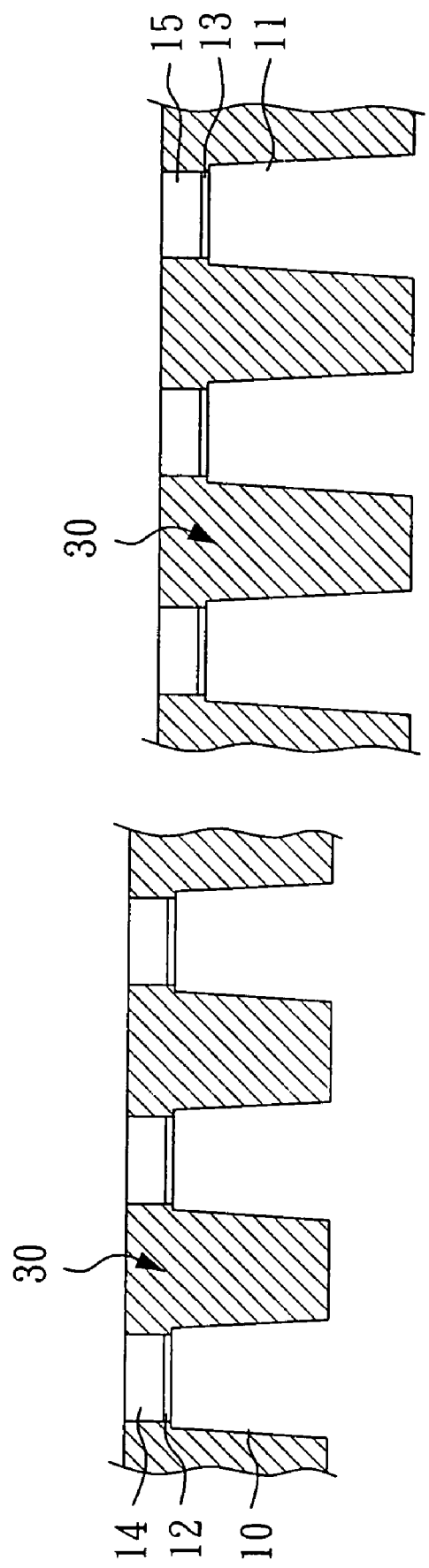
FIG. 3 shows a structure obtained by having the structure of FIG. 2 subjected to CMP.

First of all, forming shallow trench isolations to separate the respective active areas in the semiconductor structure according to known process, as shown in FIG. 1. Then, with reference to FIG. 2, applying oxide to form an oxide layer 30 on the structure having the shallow trench isolations formed therein to cover the entire structure and fill within the respective shallow trench isolations.

Figure 4:
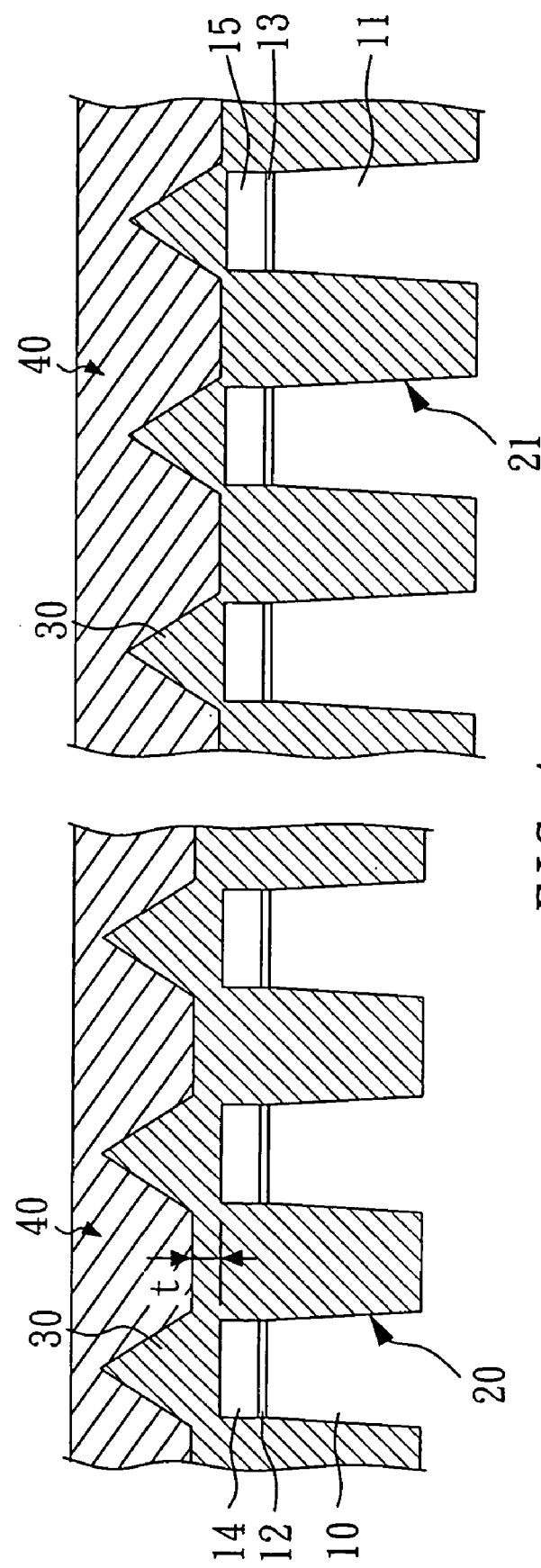
FIG. 4 shows a structure obtained by having a planarizing material layer formed on the structure of FIG. 2 in accordance with the present invention.

Before performing chemical mechanical polishing (CMP), a planarizing material layer 40 is deposited on the oxide layer 30, as shown in FIG. 4. The planarizing material layer 40 may use BPSG, and is heated to make the BPSG reflow, so as to achieve planarization. Alternatively, the planarizing material layer 40 may use anti-reflective material. Since the anti-reflective material is in flowable condition at a common operational temperature, so that planarization can be achieved. Although only these two materials are mentioned above, any proper material which is flowable under a certain condition to achieve the goal of planarization can be also used.

Figure 5:
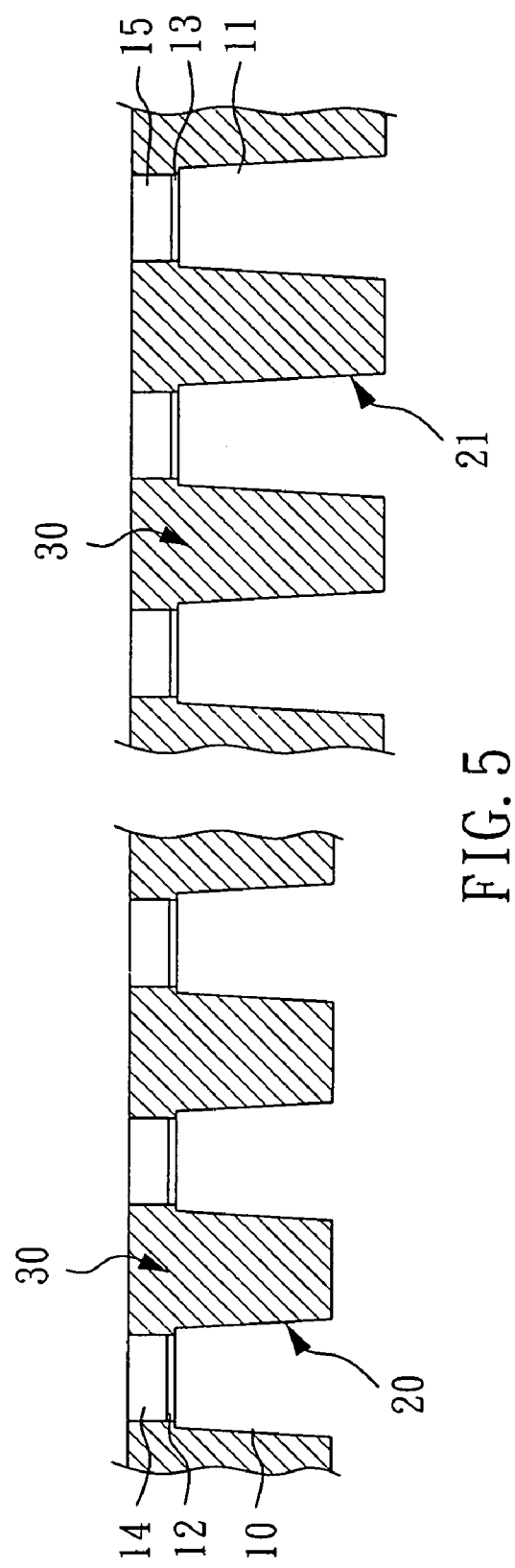
FIG. 5 shows a structure obtained by having the structure of FIG. 4 subjected to CMP.

Subsequently, chemical mechanical polishing (CMP) or any other proper polishing is performed to polish off the planarization material layer 40 and a portion of the oxide layer 30, and the obtained structure is shown in FIG. 5. As can be seen in the drawing, the heights of the STI steps at the shallow STI region and the deep STI region are uniform.

The formation of the planarization material layer 40 makes the uniformity of STI step lifted after CMP process, thereby solving the problems of STI step non-uniformity in prior art.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. An STI forming method for improving STI step uniformity in a semiconductor device, said method comprising the steps of:

providing a substrate;

forming a pad oxide layer on said substrate;

forming a pad nitride layer on said substrate, so as to constitute an intermediate structure including the substrate, pad oxide layer and pad nitride layer;

forming shallow trench isolations in said intermediate structure, said shallow trench isolations having different depths;

forming an oxide layer on the whole structure, the shallow trench isolations being filled with said oxide layer, causing the portions of the oxide layer at the shallow trench isolations having different depths to have different heights;

forming a planarization material layer on said oxide layer to offset said different heights such that said planarization material layer has a substantially planar top surface; and performing planarization process to remove said planarization material layer and planarize the top surfaces of said oxide layer and said pad nitride layer.

2. The method as claimed in claim 1, wherein the planarization material layer comprises BPSG.

3. The method as claimed in claim 2, further comprising a step of heating the planarization material layer so that said planarization material layer reflows, after the step of forming the planarization material layer.

4. The method as claimed in claim 1, wherein the planarization material layer comprises anti-reflective material.

5. The method as claimed in claim 1, wherein the planarization process comprises CMP.

6. The method as claimed in claim 1, wherein the pad nitride layer comprises silicon nitride.

* * * * *